US009190291B2

(12) United States Patent
Liang et al.

(10) Patent No.: US 9,190,291 B2
(45) Date of Patent: Nov. 17, 2015

(54) FIN-SHAPED STRUCTURE FORMING PROCESS

(71) Applicant: UNITED MICROELECTRONICS CORP., Hsin-Chu (TW)

(72) Inventors: Chia-Jui Liang, Tainan (TW); Po-Chao Tsao, New Taipei (TW); Jun-Jie Wang, Changhua County (TW); Chih-Sen Huang, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 60 days.

(21) Appl. No.: 13/934,236

(22) Filed: Jul. 3, 2013

(65) Prior Publication Data

US 2015/0011090 A1 Jan. 8, 2015

(51) Int. Cl.
*H01L 21/311* (2006.01)

(52) U.S. Cl.
CPC ................................ *H01L 21/31144* (2013.01)

(58) Field of Classification Search
USPC .......................................................... 438/703
See application file for complete search history.

(56) References Cited

U.S. PATENT DOCUMENTS 6,043,138 A 3/2000 Ibok
6,492,216 B1 12/2002 Yeo
6,921,963 B2 7/2005 Krivokapic
7,087,477 B2 8/2006 Fried
7,091,551 B1 8/2006 Anderson
7,115,525 B2 10/2006 Abatchev
7,247,887 B2 7/2007 King
7,250,658 B2 7/2007 Doris
7,309,626 B2 12/2007 Ieong
7,352,034 B2 4/2008 Booth, Jr.
7,470,570 B2 12/2008 Beintner
7,531,437 B2 5/2009 Brask
7,569,857 B2 8/2009 Simon
7,732,343 B2 6/2010 Niroomand
7,803,709 B2 9/2010 Yune
2004/0195624 A1 10/2004 Liu
2005/0051825 A1 3/2005 Fujiwara
2006/0099830 A1 5/2006 Walther
2006/0286729 A1 12/2006 Kavalieros
2007/0108528 A1 5/2007 Anderson
2007/0158756 A1 7/2007 Dreeskornfeld
2008/0157208 A1 7/2008 Fischer
2009/0004867 A1* 1/2009 Yune ............................ 438/696
2009/0124097 A1 5/2009 Cheng
2009/0242964 A1 10/2009 Akil
2009/0269916 A1 10/2009 Kang (Continued)

*Primary Examiner* — Charles Garber
*Assistant Examiner* — Stanetta Isaac
(74) *Attorney, Agent, or Firm* — Winston Hsu; Scott Margo

(57) ABSTRACT

A fin-shaped structure forming process includes the following step. A first mandrel and a second mandrel are formed on a substrate. A first spacer material is formed to entirely cover the first mandrel, the second mandrel and the substrate. The exposed first spacer material is etched to form a first spacer on the substrate beside the first mandrel. A second spacer material is formed to entirely cover the first mandrel, the second mandrel and the substrate. The second spacer material and the first spacer material are etched to form a second spacer on the substrate beside the second mandrel and a third spacer including the first spacer on the substrate beside the first mandrel. The layout of the second spacer and the third spacer is transferred to the substrate, so a second fin-shaped structure and a first fin-shaped structure having different widths are formed respectively.

14 Claims, 5 Drawing Sheets

140'
130a
122
124
130'b
110

130a
140a
S1
130b
140b
S2
122
124
t3
t4
110

(56) References Cited

U.S. PATENT DOCUMENTS

2010/0048027 A1 2/2010 Cheng
2010/0072553 A1 3/2010 Xu
2010/0144121 A1 6/2010 Chang
2010/0167506 A1 7/2010 Lin
2013/0234301 A1* 9/2013 Wang et al. .................. 257/635

* cited by examiner

FIN-SHAPED STRUCTURE FORMING PROCESS

BACKGROUND OF THE INVENTION

1. Field of the Invention

The present invention relates generally to a fin-shaped structure forming process, and more specifically to a fin-shaped structure forming process that forms fin-shaped structures having different widths.

2. Description of the Prior Art

Field effect transistors are important electronic devices in the fabrication of integrated circuits, and as the size of the semiconductor devices becomes smaller and smaller, the fabrication of the transistors also has to improve and is constantly enhanced to fabricate transistors with smaller sizes and higher quality.

With the increasing miniaturization of the semiconductor devices, various multi-gate MOSFET devices have been developed. The multi-gate MOSFET is advantageous for the following reasons. First, the manufacturing processes of the multi-gate MOSFET devices can be integrated into the traditional logic device processes, and thus are more compatible. In addition, since the three-dimensional structure of the multi-gate MOSFET increases the overlapping area between the gate and the substrate, the channel region is controlled more effectively. This therefore reduces the drain-induced barrier lowering (DIBL) effect and the short channel effect. Moreover, the channel region is longer for the same gate length. Therefore, the current between the source and the drain is increased. More precisely, a multi-gate MOSFET device includes fin-shaped structures on a substrate for gates or shallow trench isolation structures (STI) to be covered thereon, so that the gates or shallow trench isolation structures and the fin-shaped structures have multi-interfaces for forming gate channels or shallow trench isolation structures, and the widths and the lengths of the muti-interfaces decide the widths and the lengths of the gate channels, thus fin-shaped structures with different widths may be needed to achieve different purposes of multi-gate MOSFETs.

SUMMARY OF THE INVENTION

The present invention provides a fin-shaped structure forming process, which forms fin-shaped structures with different widths by transferring the layout of spacers having different thicknesses.

The present invention provides a fin-shaped structure forming process including the following steps. A first mandrel and a second mandrel are formed on a substrate. A first spacer material is formed to entirely cover the first mandrel, the second mandrel and the substrate. A patterned material is formed to cover the second mandrel while exposing the first mandrel. The exposed first spacer material is etched to form a first spacer on the substrate beside the first mandrel. The patterned material is removed. A second spacer material is formed to entirely cover the first mandrel, the second mandrel and the substrate. The second spacer material and the first spacer material are etched to form a second spacer on the substrate beside the second mandrel and a third spacer including the first spacer on the substrate beside the first mandrel. The layout of the second spacer and the third spacer is transferred to the substrate, so that a second fin-shaped structure and a first fin-shaped structure having different widths are formed respectively.

According to the above, the present invention provides a fin-shaped structure forming process, which forms multi-spacers having different thicknesses and then transfers the layout of the multi-spacers to the substrate, so fin-shaped structures are formed, wherein the multi-spacers having different thicknesses may be formed by partially removing spacer materials through etching using materials such as photoresists.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
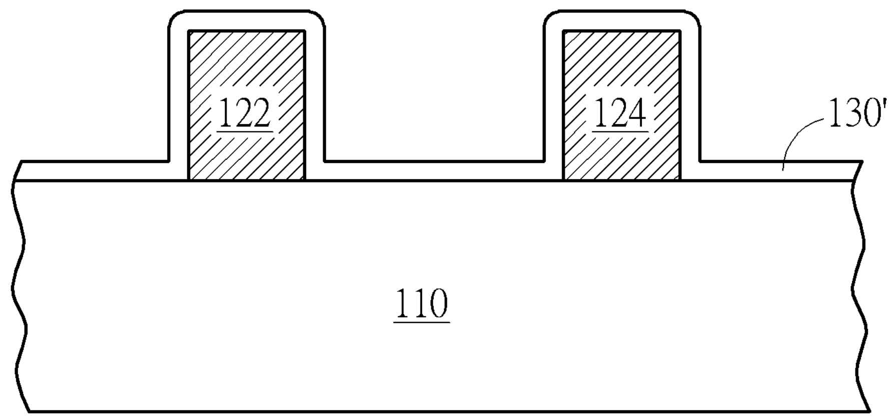
FIGS. 1-8 schematically depict cross-sectional views of a fin-shaped structure forming process according to an embodiment of the present invention.

FIGS. 1-8 schematically depict cross-sectional views of a fin-shaped structure forming process according to an embodiment of the present invention. As shown in FIG. 1, a substrate 110 is provided. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate.

A first mandrel 122 and a second mandrel 124 are formed on the substrate 110. The first mandrel 122 or/and the second mandrel 124 may be a single layer or multi layers composed of one or more than one materials, depending upon the needs. The first mandrel 122 or/and the second mandrel 124 may be a photoresist, polysilicon or hard mask layer(s), but it is not limited thereto. In one case, when the first mandrel 122 and the second mandrel 124 are polysilicon, they may be formed through the following step. A polysilicon layer entirely covers the substrate 110, and then the polysilicon layer is patterned by a photolithography process to form the first mandrel 122 and the second mandrel 124. In another case, when the first mandrel 122 and the second mandrel 124 are photoresists, they may be formed through the following step. A photoresist layer is formed and patterned to form two photoresists on the substrate 110, and a thermal process may be performed on the two photoresists to solidify the two photoresists, so the first mandrel 122 and the second mandrel 124 are formed. Thereafter, if different sizes for the first mandrel 122 and the second mandrel 124 or smaller sizes of at least one of the first mandrel 122 or the second mandrel 124 are required, a trimming process (not shown) can be performed to trim the first mandrel 122 or/and the second mandrel 124, wherein the trimming process may be a dry etching process, but it is not limited thereto.

Then, a first spacer material 130' is formed to entirely cover the first mandrel 122, the second mandrel 124 and the substrate 110. The first spacer material 130' may be nitride, but it is not limited thereto.

Figure 2:
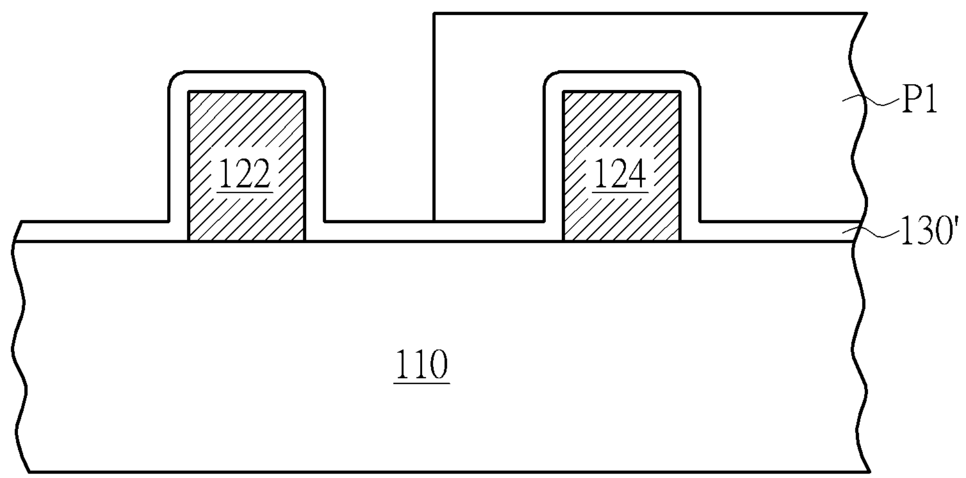
Figure 3:
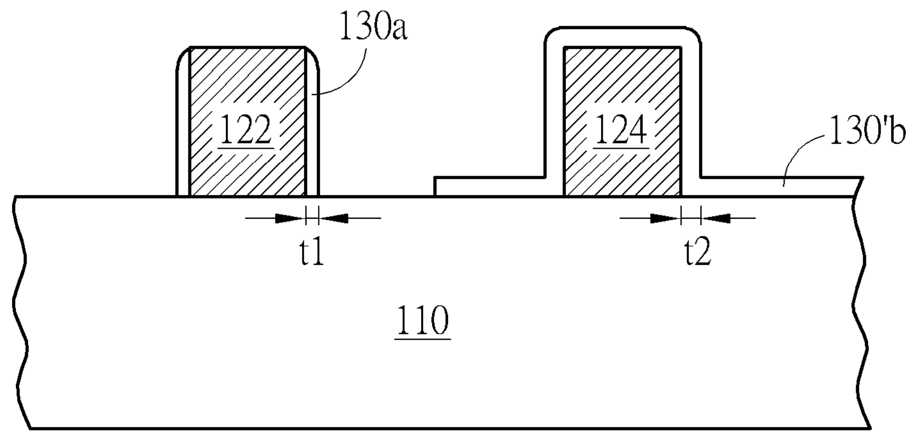
Figure 9:
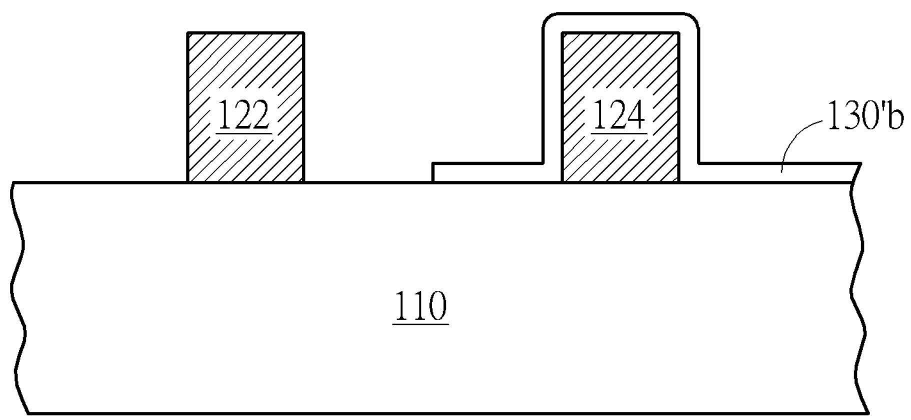
FIG. 9 schematically depicts a cross-sectional view of a fin-shaped structure forming process according to another embodiment of the present invention.

As shown in FIGS. 2-3, a first spacer **130*a* is formed on the substrate 110 on the sides the first mandrel 122 while a first spacer material 130'*b* covering the second mandrel 124 and the substrate 110 is reserved. More precisely, as shown in FIG. 2, a material (not shown) entirely covers the first mandrel 122, the second mandrel 124 and the substrate 110, and then the material is patterned to form a patterned material P1** covering the second mandrel 124 while exposing the first mandrel 122. In this embodiment, the material is a photoresist; in another embodiment, the material may be another light sensitive material, depending upon the needs. Thereafter, the exposed first spacer material 130' is etched to form a first spacer 130*a* on the substrate 110 on the sides of the first mandrel 122, as shown in FIG. 3. Then, the patterned material P1 is removed. Since the first spacer 130*a* has been formed by etching the first spacer material 130', the thickness t1 of the first spacer 130*a* preferably is thinner than the thickness t2 of the first spacer material 130'*b*. The thickness difference between the first spacer 130*a* and the first spacer material 130'*b* can lead to the thickness difference of later formed spacers, the patterns of which will be transferred to the substrate 110 to form fin-shaped structures with different widths. In one case, the thickness t1 of the first spacer 130*a* is substantially zero, so as to approach a maximum thickness difference of the later formed spacers, as shown in FIG. 9. Furthermore, in some cases, such as the thickness t1 of the first spacer 130*a* approaches a minimum feature thickness, a trimming process may be performed to trim the first spacer 130*a* to have a thickness smaller than the thickness t1, so that a refined structure can be formed. The trimming process may be a dry etching process but not limited thereto.

In this embodiment, the steps of FIGS. 1-3, i.e. a first spacer material 130' is formed to entirely cover the first mandrel 122, the second mandrel 124 and the substrate 110; a patterned material P1 is formed to cover the second mandrel 124 while exposing the first mandrel 122; the exposed first spacer material 130' is etched to form a first spacer 130*a* on the substrate 110 on the sides of the first mandrel 122 while the first spacer material 130'*b* covering the second mandrel 124 is reserved; and the patterned material P1 is removed, are just performed once. In another embodiment, the steps of FIGS. 1-3 may be performed more than once, to form a stacked spacer (not shown) on the substrate 110 on the sides of the first mandrel 122 and a stacked layer (not shown) covering the second mandrel 124. Moreover, the first spacer material 130' may include a multilayer, which may be formed by performing depositing processes many times, but it is not limited thereto.

Figure 4:
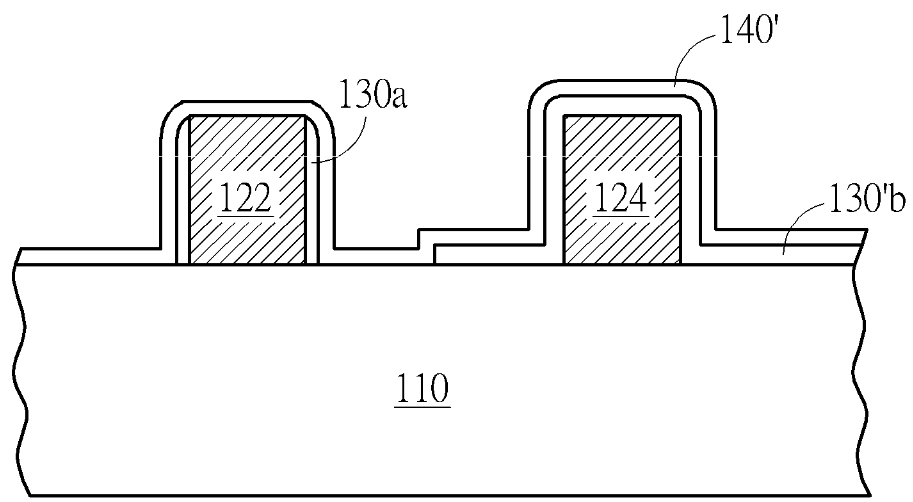
Figure 5:
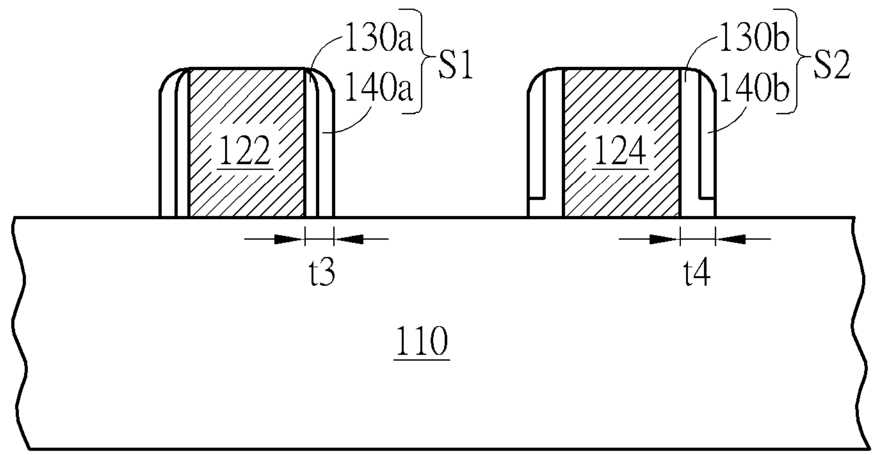

As shown in FIGS. 4-5, a second spacer S2 and a third spacer S1 with different thicknesses t4 and t3 are formed on the substrate 110 on the sides of the second mandrel 124 and the first mandrel 122 respectively. More precisely, as shown in FIG. 4, a second spacer material 140' is formed to entirely cover the first mandrel 122, the second mandrel 124 and the substrate 110. That is, the second spacer material 140' covers the first mandrel 122, the first spacer 130*a*, the second mandrel 124 and the first spacer material 130'*b*. The second spacer material 140' may be nitride, but it is not limited thereto. Then, the second spacer material 140' and the first spacer material 130'*b* covering the second mandrel 124 are etched to form a second spacer S2 including an external spacer 140*b* and an inner spacer 130*b* on the substrate 110 on the sides of the second mandrel 124, while the second spacer material 140' covering the first mandrel 122 is etched to form an external spacer 140*a*, such that a third spacer S1 is constituted by the first spacer 130*a* and the external spacer 140*a*, as shown in FIG. 5.

It is emphasized that the thickness of the third spacer S1 must be different from the thickness t4 of the second spacer S2, so that later formed fin-shaped structures with different widths can be obtained. In this embodiment, since the first spacer material 130' is etched to form the first spacer 130*a* without the first spacer material 130' covering the second mandrel 124 being etched at the same time, and since the third spacer S1 is formed by etching twice the first spacer material 130' and the second spacer material 140' respectively while the second spacer S2 is formed by only etching once the first spacer material 130' and the second spacer material 140' together, the thickness of the third spacer S1 is therefore thinner than the thickness t4 of the second spacer S2, so later formed fin-shaped structures with different widths can be achieved. Besides, the third spacer S1 includes the first spacer 130*a* and the external spacer 140*a* having pillar-shapes, while the second spacer S2 includes the inner spacer 130*b* having an L-shaped cross-sectional profile and the external spacer 140*b* having a pillar-shape. Or, the third spacer S1 merely includes the external spacer 140*a* having pillar-shapes while the second spacer S2 includes the inner spacer 130*b* having an L-shaped cross-sectional profile and the external spacer 140*b* having a pillar-shape, like in the embodiment shown in FIG. 9.

In some cases, such as when the thickness t3 or t4 approaches a minimum feature thickness, a trimming process may be performed to trim the third spacer S1 or the second spacer S2 to have a thickness smaller than the thickness t3 or t4, thereby obtaining a more refined structure. The trimming process may be a dry etching process, but it is not limited thereto.

Figure 6:
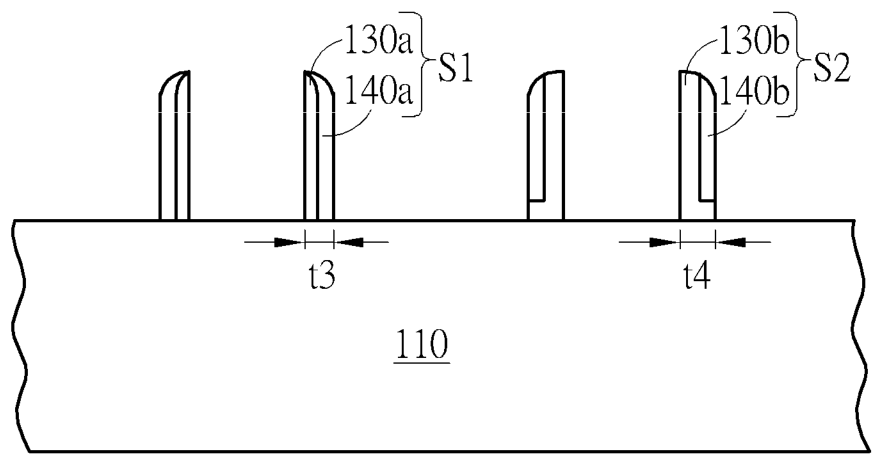
Figure 7:
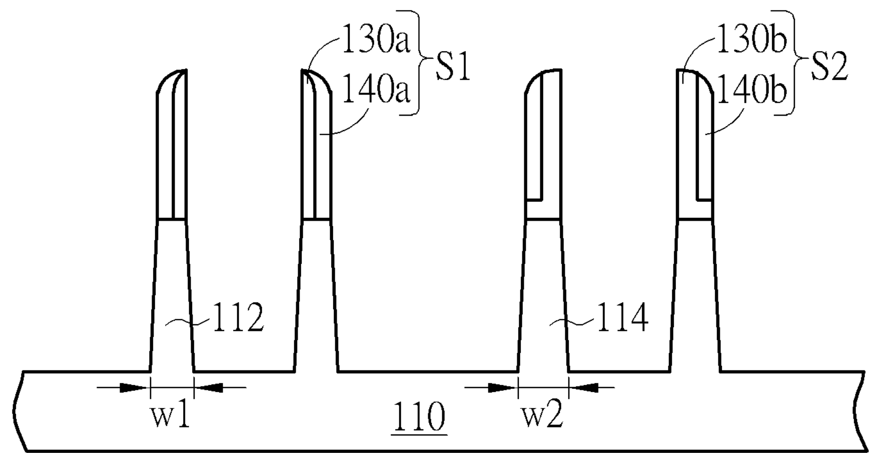
Figure 8:
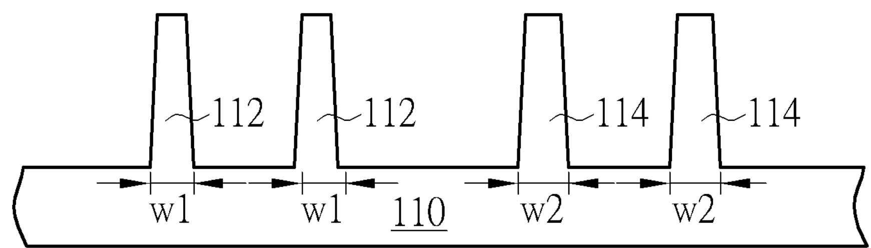

As shown in FIGS. 6-8, the layout of the second spacer S2 and the third spacer S1 is transferred to the substrate 110, so second fin-shaped structures 114 and first fin-shaped structures 112 having different widths w2 and w1 are respectively formed. More precisely, the first mandrel 122 and the second mandrel 124 are removed, as shown in FIG. 6. As shown in FIG. 7, the layout of the second spacer S2 and the third spacer S1 is transferred to the substrate 110 by methods such as etching, so that the second fin-shaped structures 114 and the first fin-shaped structures 112 are formed right below the second spacer S2 and the third spacer S1. Then, the second spacer S2 and the third spacer S1 are removed, as shown in FIG. 8. This means that the substrate 110 having second fin-shaped structures 114 and the first fin-shaped structures 112 with different widths w2 and w1 are formed, wherein the width w1 of the first fin-shaped structures 112 is smaller than the width w2 of the second fin-shaped structures 114 because of the thickness t3 of the third spacer S1 being thinner than the thickness t4 of the second spacer S2. Thereafter, a trimming process may be further performed on the first fin-shaped structures 112 or/and the second fin-shaped structures 114 to further achieve the first fin-shaped structures or/and the second fin-shaped structures having smaller and desired thicknesses, but it is not limited thereto. Other processes may be performed to improve the structure or the performance thereof.

In a preferred embodiment, the first spacer material 130' and the second spacer material 140' include different materials. For example, the first spacer material 130' covered by the second spacer material 140' can be composed by a material a having higher etching rate than that of the second spacer material 140' for the first spacer material 130' being etched easily while the material of the second spacer material 140' is hard enough to serve as a hard mask to each substrate 110, thereby decreasing costs and increasing performances, but it is not limited thereto.

To summarize, the present invention provides a fin-shaped structure forming process, which forms multi-spacers having different thicknesses and then transfers the layout of the multi-spacers to the substrate, so that fin-shaped structures are formed, wherein the multi-spacers having different thicknesses may be formed by partially removing spacer materials through etching using materials such as photoresists. For example, a first mandrel and a second mandrel are formed on a substrate; a first spacer material is entirely covered; a patterned material is formed to cover the second mandrel while exposing the first mandrel; the exposed first spacer material is etched to form a first spacer on the substrate beside the first mandrel and then the patterned material is removed. The aforesaid steps may be formed repeatedly. Then, a second spacer material is entirely covered; the second spacer material and the first spacer material are etched to form a second spacer on the substrate beside the second mandrel and a third spacer including the first spacer on the substrate beside the first mandrel; the layout of the second spacer and the third spacer is transferred to the substrate, so fin-shaped structures having different widths are formed.

Moreover, trimming processes may be further performed to trim the mandrels, the spacers or the fin-shaped structures to achieve desired sizes, especially when the sizes of these components approach minimum feature thicknesses. The mandrels may be photoresists or polysilicon, depending upon the needs.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fin-shaped structure forming process, comprising:

forming a first mandrel and a second mandrel on a substrate;

(a) forming a first spacer material to entirely cover the first mandrel, the second mandrel and the substrate;

(b) forming a patterned material to cover the second mandrel while exposing the first mandrel;

(c) etching the exposed first spacer material to forma first spacer on the substrate on the sides of the first mandrel;

(d) removing the patterned material;

(e) forming a second spacer material to entirely cover the first mandrel, the second mandrel and the substrate;

(f) etching the second spacer material and the first spacer material to form a second spacer on the substrate on the sides of the second mandrel and a third spacer comprising the first spacer on the substrate on the sides of the first mandrel; and (g) transferring the layout of the second spacer and the third spacer to the substrate, so a second fin-shaped structure and a first fin-shaped structure having different widths are respectively formed.

2. The fin-shaped structure forming process according to claim 1, wherein at least one of the first mandrel and the second mandrel comprises a photoresist or a polysilicon gate.

3. The fin-shaped structure forming process according to claim 2, further comprising:

performing a thermal process to the first mandrel and the second mandrel after the first mandrel and the second mandrel are formed by photoresists.

4. The fin-shaped structure forming process according to claim 1, wherein the first mandrel or the second mandrel is trimmed by a trimming process.

5. The fin-shaped structure forming process according to claim 4, wherein the trimming process comprises a dry etching process.

6. The fin-shaped structure forming process according to claim 1, wherein the first spacer material and the second spacer material comprise different materials.

7. The fin-shaped structure forming process according to claim 1, wherein the first spacer material has a higher etching rate than the second spacer material.

8. The fin-shaped structure forming process according to claim 7, wherein the first spacer material and the second spacer material comprise nitride.

9. The fin-shaped structure forming process according to claim 1, wherein the thickness of the first spacer is thinner than the thickness of the first spacer material.

10. The fin-shaped structure forming process according to claim 9, wherein the thickness of the first spacer is substantially zero.

11. The fin-shaped structure forming process according to claim 1, wherein the steps of (a), (b), (c) and (d) are performed more than one time, and then the steps of (e), (f) and (g) are sequentially performed.

12. The fin-shaped structure forming process according to claim 1, wherein the thickness of the third spacer is thinner than the thickness of the second spacer.

13. The fin-shaped structure forming process according to claim 1, further comprising:

performing a trimming process after the first spacer is formed to trim the first spacer.

14. The fin-shaped structure forming process according to claim 1, further comprising:

performing a trimming process after the second spacer and the third spacer are formed to trim at least one of the second spacer and the third spacer.

* * * * *